INVENTOR.
George E. Vincent Jr
BY
Shenier & O'Connor
ATTORNEYS

May 18, 1971 G. E. VINCENT, JR 3,579,376

METHOD OF FORMING A RESIST PATTERN ON A CIRCUIT BOARD OR THE LIKE

Filed July 23, 1968 2 Sheets-Sheet 2

INVENTOR.
George E. Vincent Jr
BY
Shenier & O'Connor
ATTORNEYS 3,579,376
METHOD OF FORMING A RESIST PATTERN ON A CIRCUIT BOARD OR THE LIKE George E. Vincent, Jr., Bethel, Conn., assignor to United Aircraft Corporation, East Hartford, Conn.

Filed July 23, 1968, Ser. No. 746,951
Int. Cl. H05k 3/00
U.S. Cl. 117—212 5 Claims

ABSTRACT OF THE DISCLOSURE

A method of applying a resist coating to the surface of a circuit board or the like having a plurality of holes therethrough in which the board is assembled over an opening in a pressurized fixture with the periphery of the board in fluidtight relationship with the periphery of the opening to cause the pressurizing fluid to flow through the holes and outwardly of the exposed surface of the board. Under these conditions, a coating of resist is applied to the exposed surface in any suitable manner known to the art with the fluid flowing through the holes preventing the flow of resist into the holes and keeping the holes open. At locations at which the board has relatively large holes, posts or pins on the fixture extend upwardly through the central portions of the openings to the surface of the board, the size of the posts being such as to fill the centers of the holes while leaving annular spaces therearound for the flow of fluid.

BACKGROUND OF THE INVENTION

There are known in the prior art printed circuit boards in which a pattern of conductive material is formed on the surface of an insulating board. These boards are printed with a plurality of holes at various locations through which electrical connections are made. In the process of producing the boards, it is necessary to build up a deposit of metal on the walls of the holes.

One particular method of producing printed circuit boards in the prior art employs a copper-clad board of insulating material as a base material. First, this board is sheared a convenient size so as to allow for a "plating thief" to accommodate high current densities at the outer portion of the board. Next the required holes are accurately located and drilled in the board. After the board has been cleaned and sensitized, an electroless deposit of copper is applied over the copper cladding on the board and on the walls of the holes. Next a deposit of electroplated copper of a suitable thickness such, for example, as 0.0005 inch is built up on the surface and on the hole walls.

After the initial electroplating operation, a pattern of resist material is applied to the surface of the board. This usually is done by a silk screen process in which a positive is made from the master drawing. When that has been done a plastic film emulsion is contact-printed by conventional methods. The developed film and emulsion are pressed onto the wire or silk screen filling the part of the mesh required for the wiring pattern. Following heat-curing, the plastic film is stripped and a resist is applied to the board through the screen. The screen is then removed leaving only the desired circuit pattern exposed for further electroplating.

When the resist pattern has been applied to the board in the manner described, the electroplating operation is continued until a minimum thickness of copper of 0.0015 inch in the holes is achieved. This operation of plating only those areas of the board which are to become the desired circuit pattern conserves both copper and the copper etching solution. When the desired thickness of copper has been built up in this manner, a tin-lead alloy is plated over the copper to a thickness of about 0.0005 inch. Next, the plating resist pattern is removed and the copper is etched away from all areas of the board where copper is exposed, leaving the desired pattern of copper on the board. In this particular process, the desired pattern is protected from the action of the etching by the tin-lead alloy.

The process described above is satisfactory for the production of relatively simple circuit boards having few holes and ample circuit-to-circuit clearances. On circuit boards with many closely spaced holes and much fine line detail, the process described above has not proved as satisfactory as is desirable. Investigation has shown that the difficulty encountered in using the process of the prior art to form relatively complicated circuit boards having many closely spaced holes or much fine line detail, or both, lies in the silk screen process. As has been described hereinabove, in that process a developed mask emulsion of the desired circuit pattern is transferred to the screen and heat cured and then the resist is applied to the board through the screen. During these operations, distortions of the printed pattern occur as a result of shrinkage of the pattern during curing of the emulsion, for example. Moreover, the pattern may shift as it is transferred to the screen. Consequently, when the resist is screened onto the board, misalignment between the holes and the pattern and loss of fine line detail result.

The most precise method known in the prior art for forming a resist pattern from a photographic master on a substrate is the technique of photographically printing the pattern directly on the substrate. This can be achieved by applying a coat of undeveloped resist to the substrate, exposing it to a negative of the desired pattern, developing the exposed resist and then washing away the undeveloped resist to leave the desired pattern. This method of applying the resist pattern would be thought to provide a solution to the problem outlined above of forming a pattern having much fine line detail on a board having a large number of closely spaced holes.

While the method of directly photographically printing the pattern on the board provides an apparent solution to the problem outlined above, it has not proved to be successful in the prior art. I have discovered that the reason for the failure of this method of producing resist patterns in the prior art results from the fact that standard methods of applying the undeveloped resist such, for example, as spin coating, dipping, spraying and roller coating, all cause the resist to flow into or cover the holes and even to fill the holes. It will readily be apparent that this trapped resist prevents further deposition of metal on the hole walls.

I have invented a method of applying a photoresist coating to a printed circuit board which overcomes the defects of methods of the prior art of applying resist coatings to boards. My method is especially applicable to fine line patterns on the surface of the boards having a large number of closely spaced holes. It permits the resist pattern to be directly photographically printed on the surface of the board without filling up or covering the board holes. My method is simple and expeditiously carried out.

SUMMARY OF THE INVENTION

One object of my invention is to provide a method of applying a resist coating to the surface of a board which overcomes the defects of methods of the prior art.

Another object of my invention is to provide a method of expeditiously applying a fine line resist pattern accurately to the surface of a board having many closely spaced holes.

A further object of my invention is to provide a method of photographically printing a resist pattern directly on the surface of a circuit board without filling or covering the holes of the board.

Still another object of my invention is to provide a method of applying a resist coating to a circuit board having many closely spaced holes in a simple and expeditious manner.

Other and further objects of my invention will appear from the following description.

In general my invention contemplates the provision of a method of applying a resist coating to the surface of a circuit board having holes therein in which I assemble the board over an opening in a pressurizable fixture with a fluidtight seal between the periphery of the board and the periphery of the opening. With the board in position, I apply a pressurizing fluid to the board to cause the fluid to flow through the board holes and outwardly of the surface to be coated. The undeveloped resist can then be applied to the surface by any suitable method of the prior art and the fluid flowing through the holes prevents the resist from covering or flowing into the holes. Where the board has relatively large holes, I provide the fixture with posts or pins extending upwardly through the large holes to the surface of the board to fill up the centers of these holes while leaving annular spaces for the flow of fluid between the perimeters of the holes and the posts. When the resist coating has thus been applied, the desired pattern is photographically produced in the manner known in the prior art.

BRIEF DESCRIPTION OF THE DRAWINGS

In the accompanying drawings which form part of the instant specification and which are to be read in conjunction therewith and in which like reference numerals are used to indicate like parts in the various views.

DESCRIPTION OF THE PREFERRED EMBODIMENT

Figure 1:
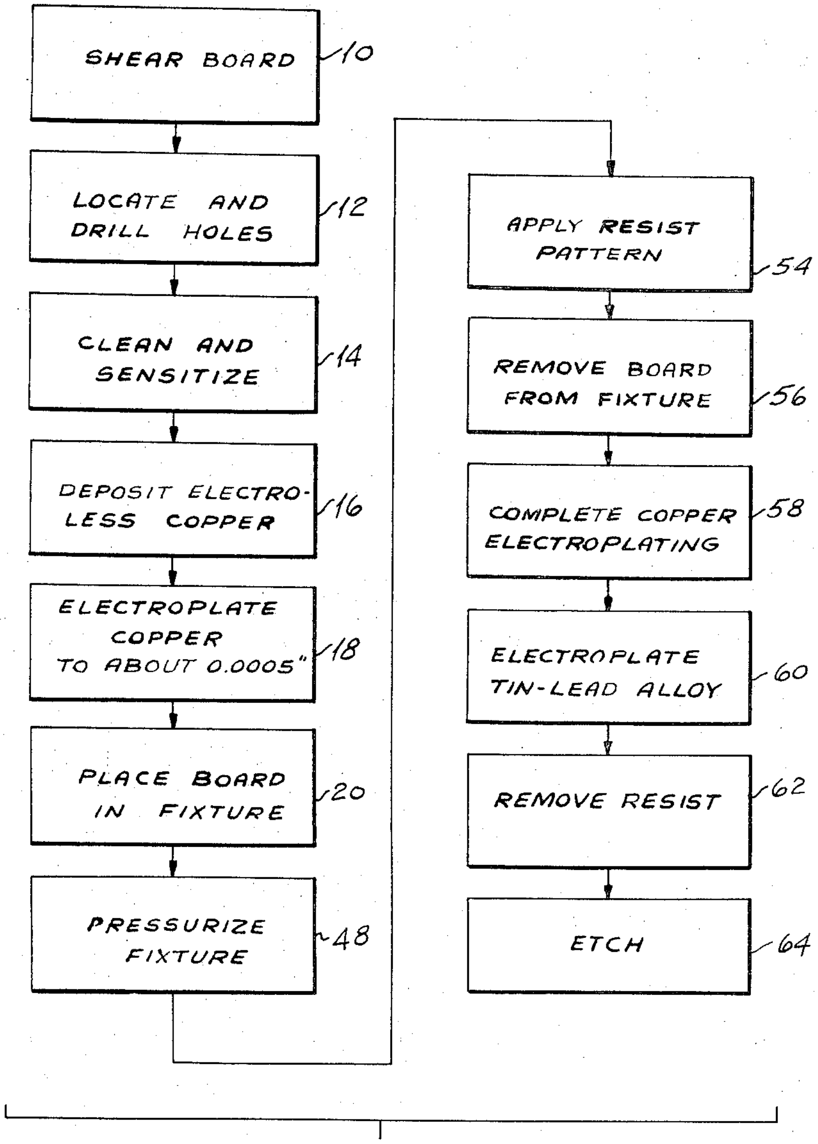
FIG. 1 is a block diagram illustrating the steps of a method of forming a circuit pattern on a board by use of my method of applying a resist coating to the board.

Referring now to the drawings, in order to produce a printed circuit board by a method incorporating my method of applying a resist coating to the surface of the board, I first perform a number of steps according to the method known in the prior art. Specifically, as indicated by the block 10, a suitable base material such, for example, as copper-clad insulating board is first sheared to a convenient size which allows for a "plating thief" to accommodate high current densities at the outer portion of the board. Next, the holes required in the final assembly are located and drilled, as indicated by the block 12. The drilled board is then cleaned and sensitized by the method known in the prior art, as indicated by the block 14. The drilled, cleaned and sensitized board then is subjected to an electrode's copper plating step, indicated by block 16, to deposit a copper film on the surface of the board and on the walls of the holes through the board. Next, I perform the preliminary copper electroplating step, indicated by the block 18, in which I provide an initial deposit of copper on the surface and on the hole walls to a thickness of about 0.0005 inch.

Having performed the preliminary steps of the process of forming a circuit board up to the point at which the initial electroplating operation has been completed, I next perform the first step of my method of applying a resist coating to the surface of the board by placing it in a pressurizable fixture, as indicated by block 20.

By way of example in the drawings, I have shown a circuit board 22, the principal portion of which may be made of any suitable insulating material such, for example, as a glass fiber reinforced synthetic resin or the like. The board 22 carries a metallic coating 24 which is made up of the original cladding material plus the preliminary plating described hereinabove. The board is formed with a plurality of relatively small holes 26 and with a number of relatively larger holes 28 formed during the drilling operation described hereinabove. The fixture, indicated generally by the reference character 30, which I employ in my method may have a rectangular, generally box-like shape having a top opening 32 and a peripheral shoulder 34. The shape of the opening 32 generally conforms to the shape of the board 22. In order to assemble the board 22 over the opening 32, I first place a gasket 36 on the shoulder 34 and then place the board 22 on the gasket. The sealing gasket may of course be made of any suitable material such, for example, as natural or synthetic rubber or the like.

After placing the board 22 on the gasket 34, I then place a generally rectangular frame 38, having a peripheral outline generally conforming to that of the board, over the board. I next clamp the board 22 and the gasket 36 between the frame 38 and the shoulder 34. By way of example, I may screw a plurality of lugs 40 to the fixture 30 at spaced locations therearound by means of screws 43 so that the lugs bear on the frame 38 to achieve the clamping operation. It will readily be appreciated that where I use the fixture 30 in a mass production operation in which a large number of boards are to be made, I may employ any suitable quick release clamping mechanism instead of the clamping lugs 40.

In order to restrict the openings provided by holes 28 to avoid the loss of fluid pressure, I incorporate a plurality of posts 42 in the fixture. These posts extend from the base of the fixture upwardly through the larger openings 28 to the upper surface of the board, which is the surface to be coated. The size of the posts is such that, while they fill the central portions of the openings 28, they leave a small annular space between the edge of the hole and the post to permit the escape of fluid in a manner to be described.

Where a very large number of boards of the same type are being produced, I may permanently secure the posts 42 to the base of the fixture 30 at locations at which the posts will properly register with the larger holes 28 of the board. Alternatively, in order to adapt my fixture to a number of boards having openings 28 at different places, I may form the fixture base with a plurality of threaded bores 44 into which posts 42 can selectively be threaded so as to accommodate a variety of boards.

I secure a fitting 46 extending through the wall of the fixture to the fixture to permit a suitable source of fluid under pressure to be connected to the fitting, thus to pressurize the fixture. By way of example, I may connect a compressed air hose (not shown) to the fitting 46 to pressurize the fixture 30 to cause jets of air to flow through the holes 26 and 28 and upwardly from the surface of the board 22 which is to be coated. With the fixture thus pressurized, as indicated by the block 48, I next apply the coating 50 of resist to the surface of the board. This may be achieved by any suitable method known to the art. For example, the resist may be applied by spin coating, dipping, spraying or roller coating, or any other suitable method. I so regulate the pressure of the air or other gas supplied to the fixture as to cause the gas issuing from the holes to be at a sufficient velocity as to prevent the resist being applied from bridging over or entering the holes.

Once the resist coating 50 has been applied to the board, I next expose it to a negative of the desired conductive pattern and then develop the exposed resist in the manner known to the art. When that has been done, I wash away the undeveloped resist from the unexposed areas to leave a resist coating 50 having a plurality of open regions 52 corresponding to the areas of the board wherein it is desired to form the conductive pattern.

Figure 4:
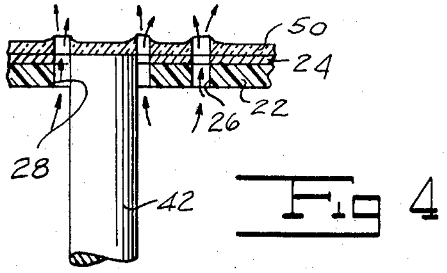
FIG. 4 is a fragmentary sectional view of a portion of a circuit board illustrating the operation of my method in the course of application of a resist coating on the board.
Figure 2:
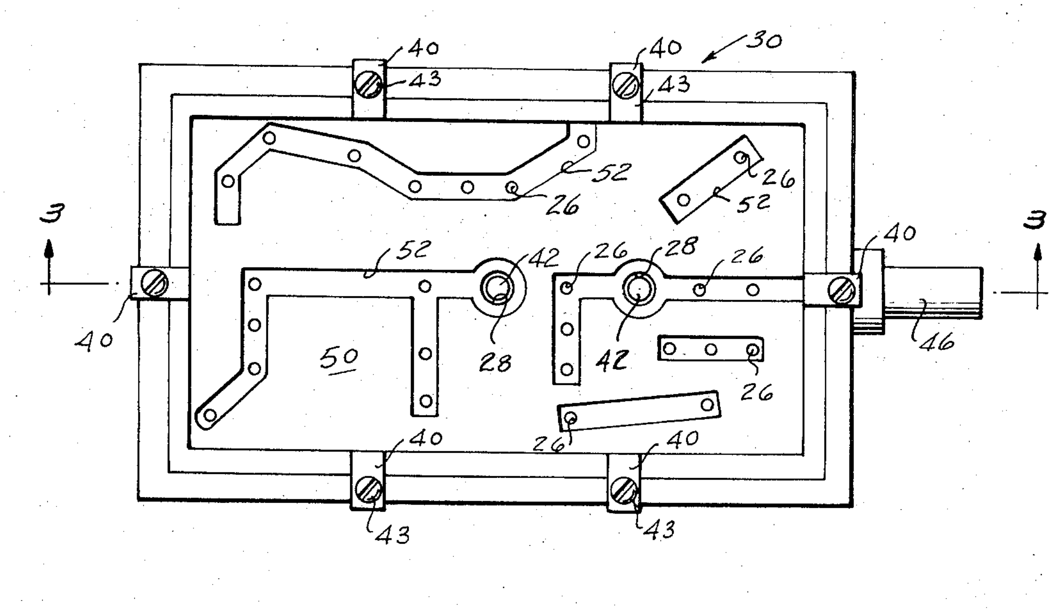
FIG. 2 is a plan view of a circuit board assembly in my pressurizable fixture and showing the coating produced on the board surface by use of my method.
Figure 3:
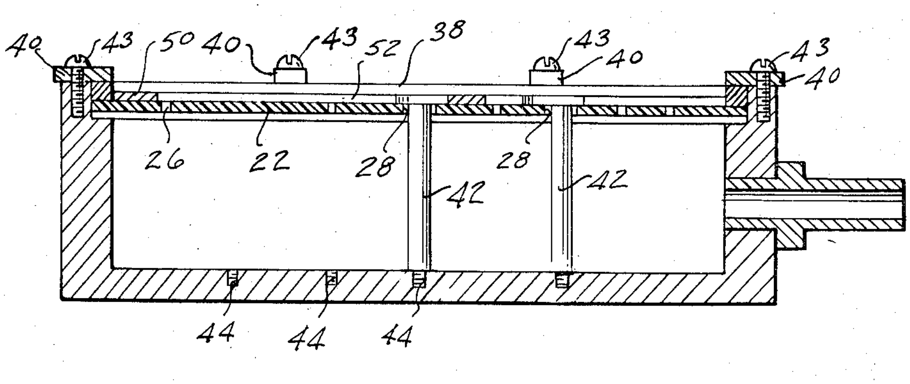
FIG. 3 is a sectional view of the assembly illustrated in FIG. 2 taken along the line 3—3 of FIG. 2.

In this manner I form a resist negative pattern of the desired pattern of conductive material, as indicated by the block 54 in FIG. 1. While I have shown the board carrying the completed resist pattern as being in the fixture in the drawings, it will be appreciated that after the undeveloped resist coating has been applied, it may be desirable to remove the board from the fixture before exposing the resist and developing the pattern. It will, moreover, be appreciated that the fluid pressure to the fixture is cut off before exposing the resist and developing the pattern. The unique appearance of the resist pattern applied by my method is illustrated in FIG. 4, in which the periphery of each of the holes has a craterlike appearance owing to the effect of the jets of air on the resist being applied to the surface. Having applied the resist pattern, the board is removed from the fixture, as indicated by block 56. As has been explained hereinabove, it may be that the board is removed from the fixture before exposure and development of the resist pattern.

Following the application of the pattern, the copper electroplating operation is completed until a film of copper having a thickness of about 0.0015 inch has been built up on the surface of the board and on the hole walls as indicated by block 58. Next, as indicated by the block 60, a thin film of tin-lead alloy or gold or the like of about 0.0005 inch thickness is electroplated over the copper to protect the copper plate during the etching operation. Following that operation, the resist is removed, as indicated by block 62, in any suitable manner known to the art and the exposed copper of the cladding and initial electroplating in the areas formerly covered by the resist are etched away as indicated by block 64. Any suitable etchant which will attack the copper but not the tin-lead alloy may be employed in this step. At this point, the desired pattern of conductive material has been applied to the surface of the board and to the walls of the holes.

To summarize the practice of a process of forming a conductive pattern on a circuit board, I first shear the board to size, locate and drill the required holes therein, clean and sensitize the board, deposit a thin film of electroless copper on the cladding and in the holes and then initially electroplate the copper onto the surface and into the holes to a thickness of about 0.0005 inch. I next place the board in the fixture 30 and clamp the board and the gasket 36 between the frame 38 and the shoulder 34 with a gastight seal. In the course of thus assembling the board on the fixture, the posts or pins 42 fill the centers of the larger holes 28 while leaving a small annular space between the upper ends of the pins and the peripheries of the holes. The fixture is pressurized by supplying compressed air or the like to the fitting 46 to cause the air to jet upwardly from the openings 26 and 28. Undeveloped resist is applied to the upper surface of the board by spin coating, dipping, spraying, rolling or the like. Air emanating from the holes 26 and 28 prevents the resist from entering the holes. When the coating has thus been applied, it is first baked and then is exposed to light in a negative pattern of the desired pattern of conductive material. The exposed areas are developed and the unexposed resist is washed away to leave the areas 52 open for further electroplating. Exposure and development may take place either while the board is in the fixture or after removal of the board from the fixture. Next, the electroplating operation is completed, the protective alloy is applied on the pattern, the resist is removed and the exposed copper areas not covered with the protective alloy are etched away to complete the pattern.

It will be seen that I have accomplished the objects of my invention. I have provided a method of applying a resist pattern to a circuit board which overcomes the defects of methods of the prior art. My method permits a fine line resist pattern to be accurately applied to a circuit board having a large number of closely spaced holes. It permits the application of a resist pattern to a circuit board without bridging over or filling the holes of the board. It is relatively simple and is expeditiously carried out.

It will be understood that certain features and subcombinations are of utility and may be employed without reference to other features and subcombinations. This is contemplated by and is within the scope of my claims. It is further obvious that various changes may be made in details within the scope of my claims without departing from the spirit of my invention. It is, therefore, to be understood that my invention is not to be limited to the specific details shown and described.

Having thus described my invention, what I claim is:

1. A method of applying a photoresist coating over the surface of a circuit board having a hole therein including the steps of partially blocking the central portion of said hole to leave an annular opening for the flow of fluid, flowing a fluid through the unblocked portion of said hole and applying said resist to said surface while flowing said fluid through said hole.

2. A method as in claim 1 in which said blocking and flowing steps comprise assembling said board over an opening in a pressurizable fixture with the end of a post on said fixture extending into said hole and supplying fluid under pressure to said fixture.

3. A method as in claim 1 in which said resist applying step comprises roller coating said surface with said resist.

4. A method as in claim 1 in which said resist applying step comprises spraying said surface with said resist.

5. A method as in claim 1 in which said resist applying step comprises spin coating said surface with said resist.

References Cited

UNITED STATES PATENTS 3,294,576 12/1966 Geraghty ........... 117—97

ALFRED L. LEAVITT, Primary Examiner

A. GRIMALDI, Assistant Examiner

U.S. Cl. X.R.

117—98; 118—63